United States Patent
Tung et al.

(10) Patent No.: US 6,459,308 B1
(45) Date of Patent: Oct. 1, 2002

(54) METHOD AND SYSTEM DESIGN WITH SYSTEMATIC ADJUSTMENT OF INDIVIDUAL BUILDING BLOCKS FOR HIGH SPEED BIPOLAR CIRCUITS

(75) Inventors: John C. Tung; Minghao Mary Zhang, both of Cupertino, CA (US)

(73) Assignee: Qantec Communication, Inc., Cupertino, CA (US)

( * ) Notice: Subject to any disclaimer, the term of this patent is extended or adjusted under 35 U.S.C. 154(b) by 0 days.

(21) Appl. No.: 10/107,946

(22) Filed: Mar. 26, 2002

Related U.S. Application Data

(63) Continuation-in-part of application No. 09/947,643, filed on Sep. 5, 2001.

(51) Int. Cl.[7] .............................................. H03B 19/00
(52) U.S. Cl. ..................................................... 327/114
(58) Field of Search ........................ 327/113–118, 432; 377/47, 48

(56) References Cited

U.S. PATENT DOCUMENTS

| | | | |
|---|---|---|---|
| 5,945,858 A | * 8/1999 | Sato | 327/115 |
| 6,166,571 A | * 12/2000 | Wang | 327/115 |
| 6,249,157 B1 | * 6/2001 | Nakura et al. | 327/115 |
| 6,282,255 B1 | * 8/2001 | La Rosa et al. | 377/47 |

* cited by examiner

*Primary Examiner*—My-Trang Nu Ton
(74) *Attorney, Agent, or Firm*—Chi Ping Chang; Pacific Law Group LLP

(57) ABSTRACT

A method of designing an electronic circuit system with multiple Bipolar transistor is presented. With this method, the circuit parameters of the various components of the individual functional building blocks of the system are systematically adjusted to minimize the many deteriorating effects resulting from system-level interactions among these functional building blocks. In one embodiment, the method is applied to a Bipolar IC that is a Divide-by-16 divider where the functional building blocks are four Divide-by-2 dividers. The resulting improvement of output signal ripple from each divider stage is graphically presented. In another embodiment, the method is applied to another Bipolar IC that is a Bang Bang Phase Detector where the functional building blocks are three Master Slave D-Type Flip Flops. The resulting improvement of output signal ripple is also graphically presented.

20 Claims, 9 Drawing Sheets

Remark: CLK = Logic Inversion of CLK, etc.

Fig. 3A-1 TYPICAL PRACTICE: f(CLK) = 10 GHz, f(DOUT1) = 5 GHz
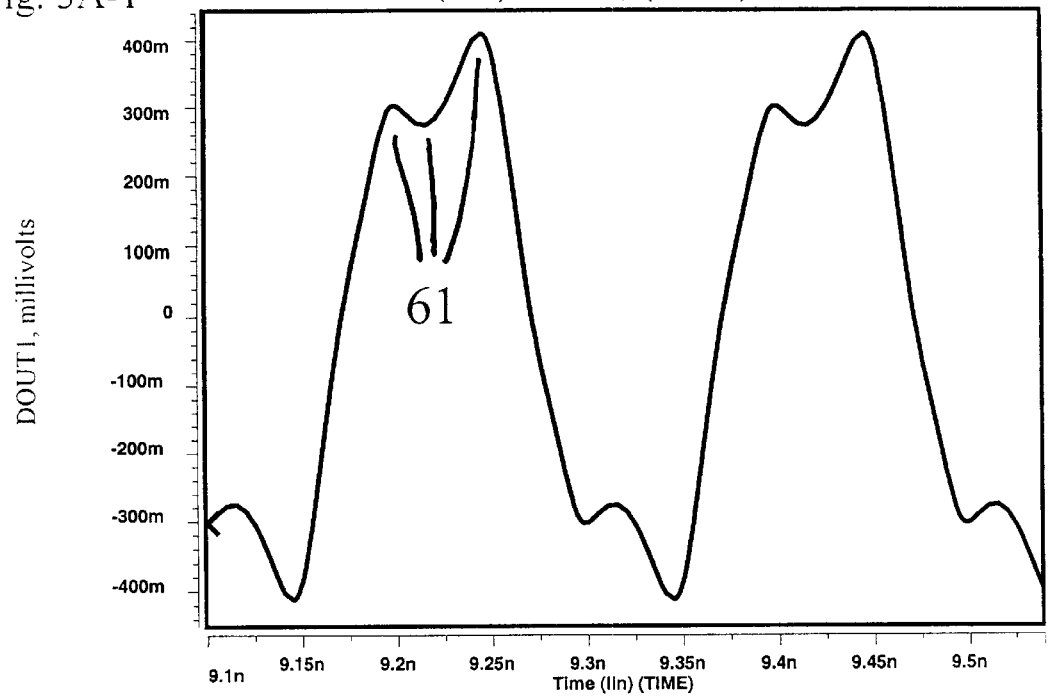
Fig. 3A-2 PRESENT INVENTION: f(CLK) = 10 GHz, f(DOUT1) = 5 Ghz
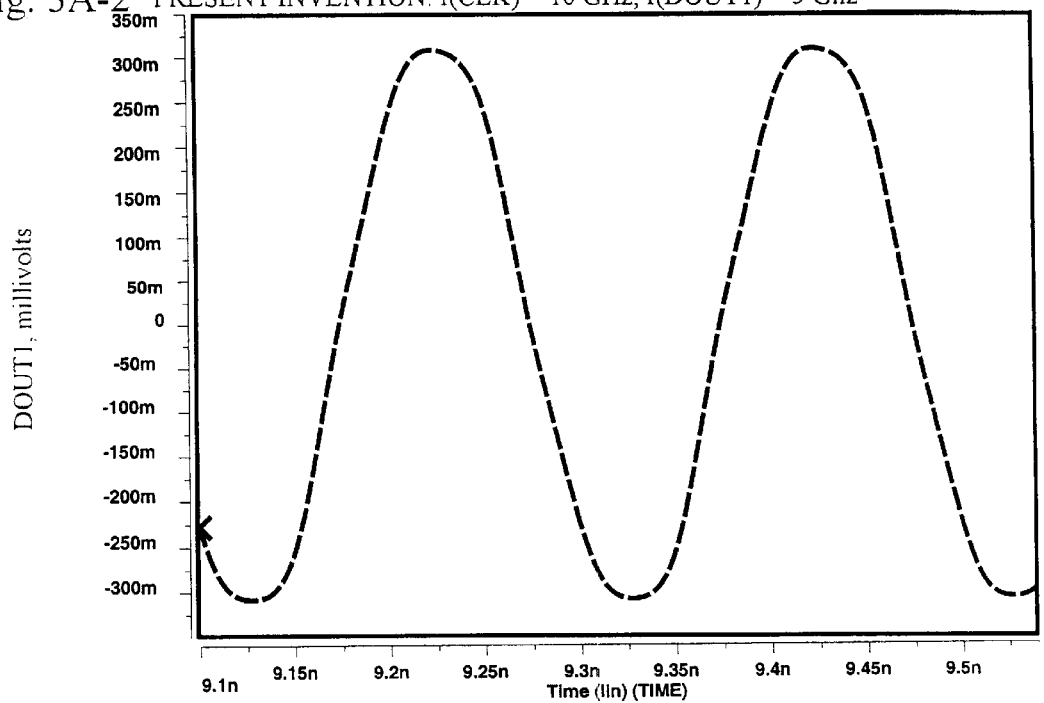

Fig. 3B-1 TYPICAL PRACTICE: f(CLK) = 10 GHz, f(DOUT2) = 2.5 GHz
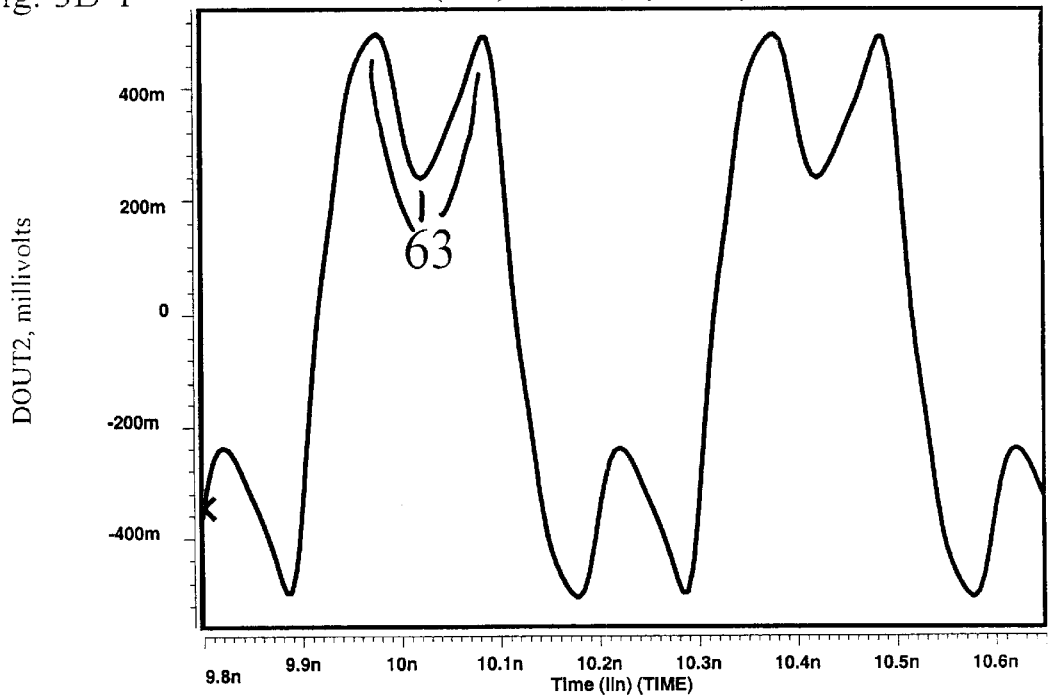
Fig. 3B-2 PRESENT INVENTION: f(CLK) = 10 GHz, f(DOUT2) = 2.5 Ghz
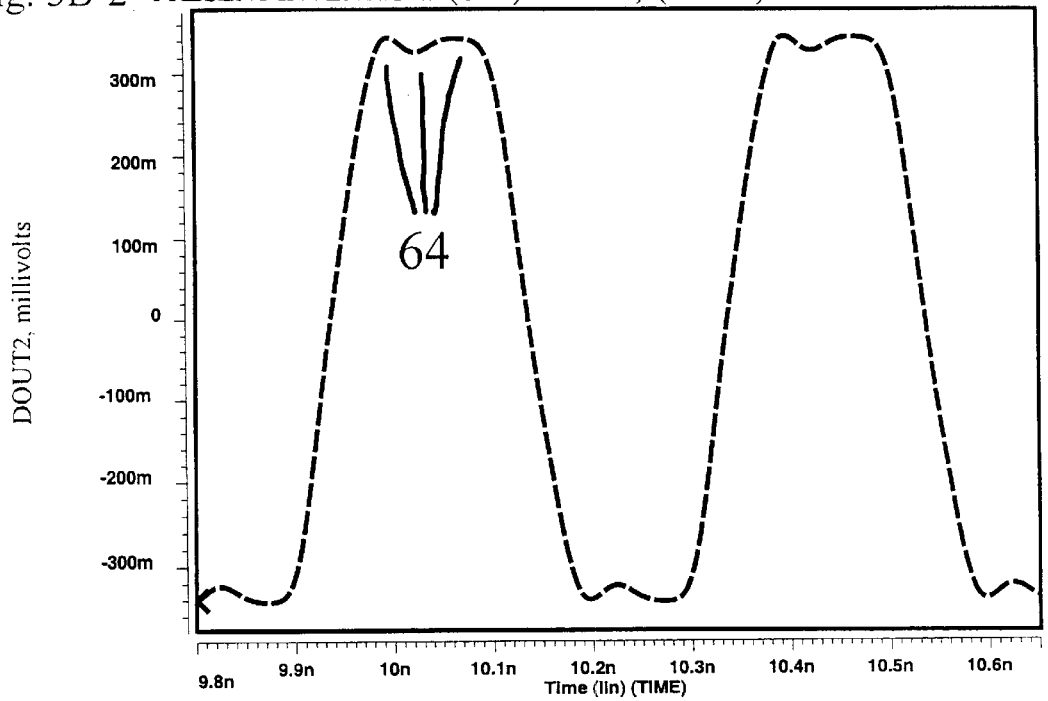

Fig. 3C-1  TYPICAL PRACTICE: f(CLK) = 10 GHz, f(DOUT3) = 1.25 GHz
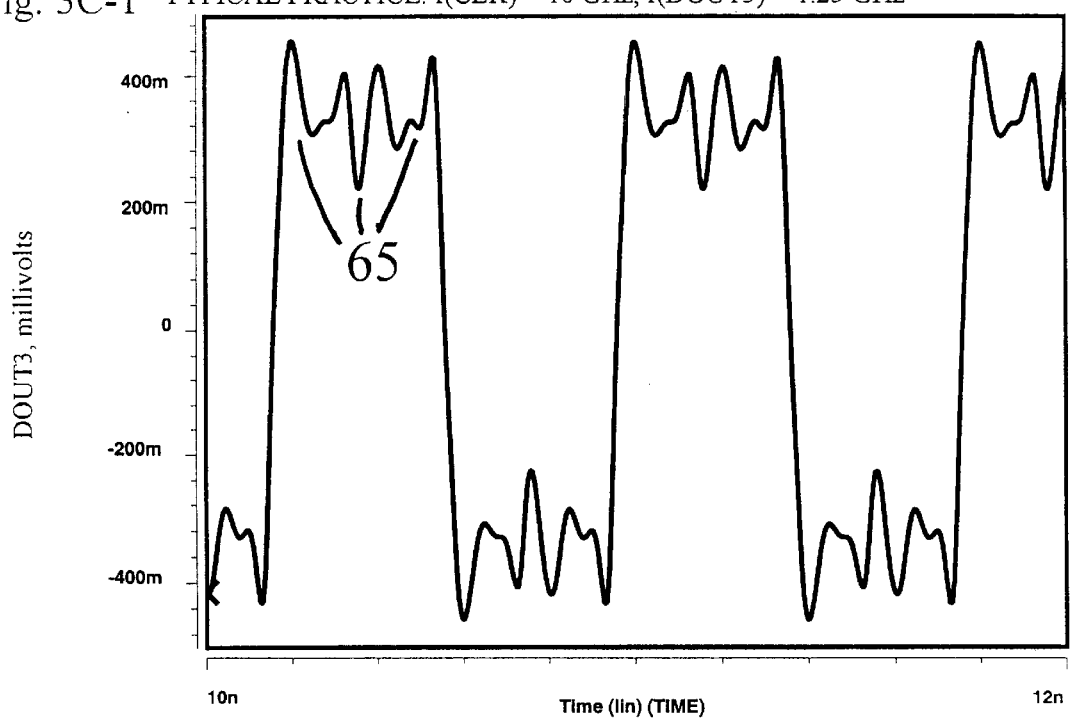
Fig. 3C-2  PRESENT INVENTION: f(CLK) = 10 GHz, f(DOUT3) = 1.25 Ghz
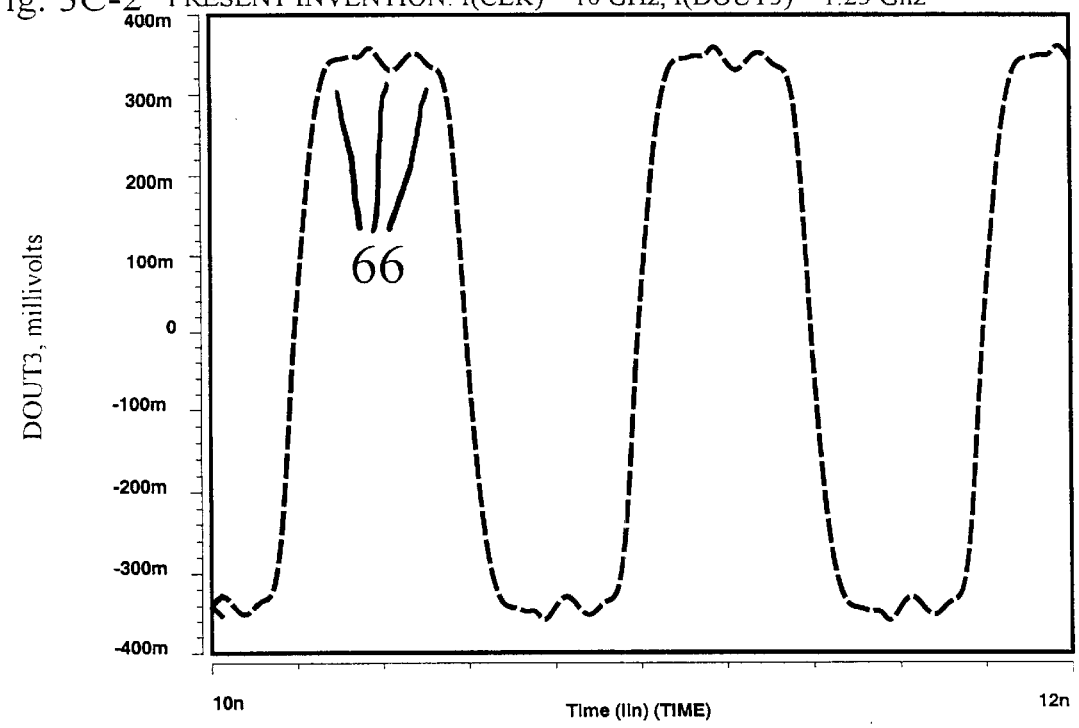

Fig. 3D-1  TYPICAL PRACTICE: f(CLK) = 10 GHz, f(DOUT4) = 0.625 GHz
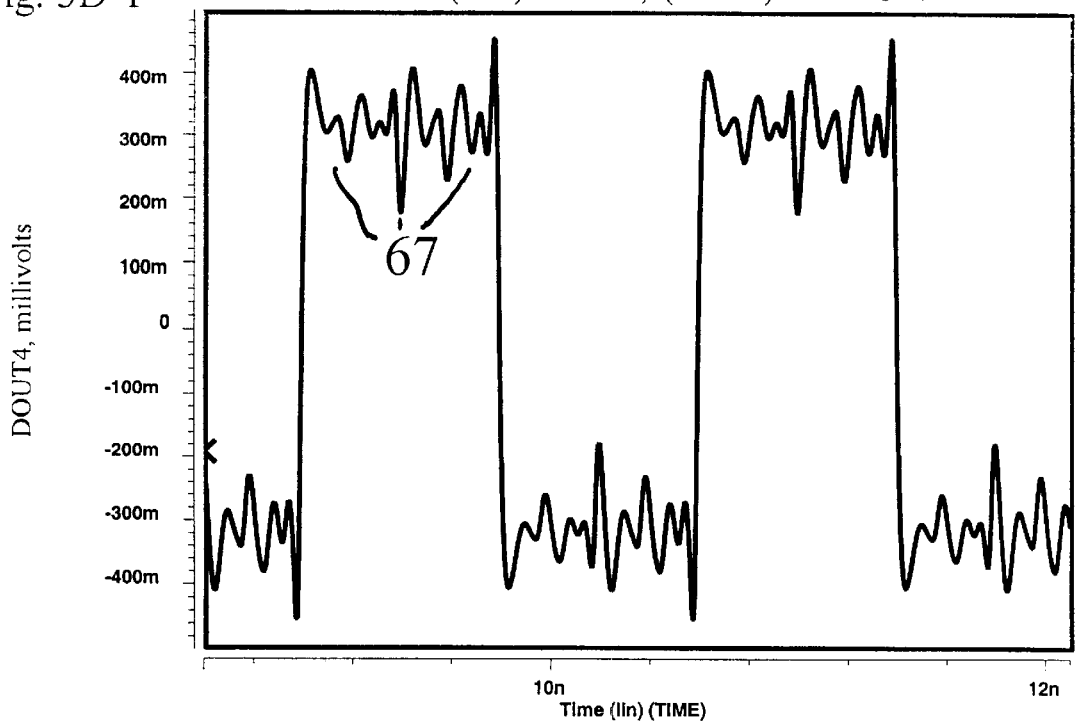
Fig. 3D-2  PRESENT INVENTION: f(CLK) = 10 GHz, f(DOUT4) = 0.625 Ghz
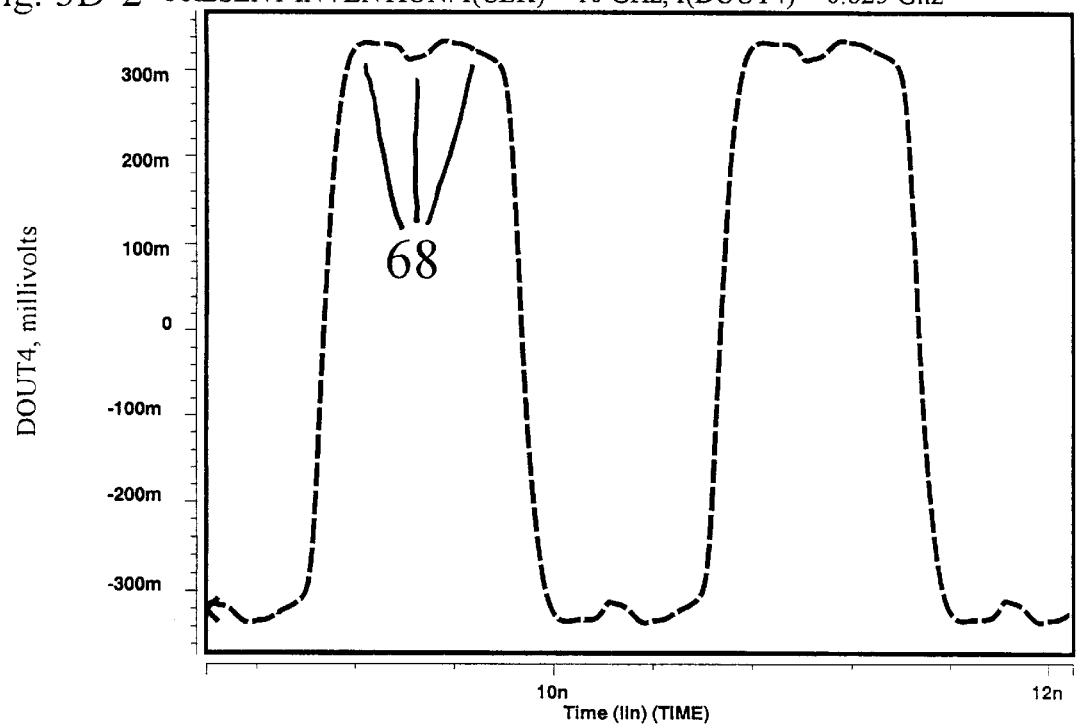

Remark: CLK = Logic Inversion of CLK, etc.

METHOD AND SYSTEM DESIGN WITH SYSTEMATIC ADJUSTMENT OF INDIVIDUAL BUILDING BLOCKS FOR HIGH SPEED BIPOLAR CIRCUITS

CROSS REFERENCE TO RELATED APPLICATIONS

This application is a continuation-in-part application of a prior U.S. application of Ser. No. 09/947,643, filed Sep. 5, 2001 by the same inventors, now pending.

FIELD OF INVENTION

The present invention relates generally to the field of data communication. More particularity, the present invention concerns a generic design and methodology of a new family of Bipolar Integrated Circuits (IC) that is capable of moving data up to a speed of 40 Gbit/Sec or higher when implemented on Silicon with a 0.18 μm or lower wafer process. Thus, its direct applications include a variety of subsystem and system functions such as Master Slave D-type Flip Flop (MS-DFF), Divider, Bang Bang Phase Detector (BBPD), Frequency Detection (FD), Phase and Frequency Detection (PFD), Voltage Controlled Oscillator (VCO) and Phase Locked Loop (PLL) in an optical switch IC for data communication.

BACKGROUND OF THE INVENTION

Optical fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec.

However, short of a completely optical communication system, the practically realizable bandwidth of fiber optical communication systems has been limited by the need of signal conversion between optical and electrical domain and the associated electronics hardware. While the usage of CMOS (Complementary Metal Oxide Semiconductor) ICs, having a moderate speed capability, has already migrated into the electronics hardware for optical communication systems due to their advantage of low manufacturing cost, low operating power consumption, low supply voltage requirement and fairly good circuit density, Bipolar technology, having a speed higher than CMOS technology, should still be employed where an even higher speed beyond the CMOS capability is needed.

Notwithstanding the employment of Bipolar technology, to approach its fundamental speed capability in real circuits for such ultra high speed applications, a balanced systems design methodology must be developed. Khaled and Elmasry published analysis and optimization of two-level, series-gated CML (Current Mode Logic) and ECL (Emitter Coupled Logic) high-speed Bipolar circuits with an analytical approach including transistor parasitics and transistor size variation between different levels to maximize their operating speed, albeit no actual output waveforms were presented (see Khaled M. Sharaf and Mohamed I. Elmasry, IEEE Journal on Solid-State Circuits, Vol. 31, No. 2, February 1996). While mentioning the possibility of a circuit optimization procedure based upon SPICE simulations, the Khaled publication stated that this simulation procedure requires a very large number of simulation runs to cover the related design space thus was difficult to practice.

SUMMARY OF THE INVENTION

The present invention is directed to a new family of Bipolar ICs and a generic design methodology of designing this new family of Bipolar ICs capable of moving data up to a speed of 40 Gbit/Sec when implemented on Silicon with a 0.18 μm or lower wafer process.

The first objective of this invention is to achieve a generic design and methodology for a family of Bipolar ICs with a reduced amount of signal ripple after the respective logic signal levels are reached following a switching operation.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein:

FIG. 3A compares the output signal ripple between a typical practice and the current invention of a first building block of Divide-by-2 divider for the Divide-by-16 divider in FIG. 2B;

FIG. 3B compares the output signal ripple between a typical practice and the current invention of a second building block of Divide-by-2 divider for the Divide-by-16 divider in FIG. 2B;

FIG. 3C compares the output signal ripple between a typical practice and the current invention of a third building block of Divide-by-2 divider for the Divide-by-16 divider in FIG. 2B;

FIG. 3D compares the output signal ripple between a typical practice and the current invention of a fourth building block of Divide-by-2 divider for the Divide-by-16 divider in FIG. 2B;

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figure 1:
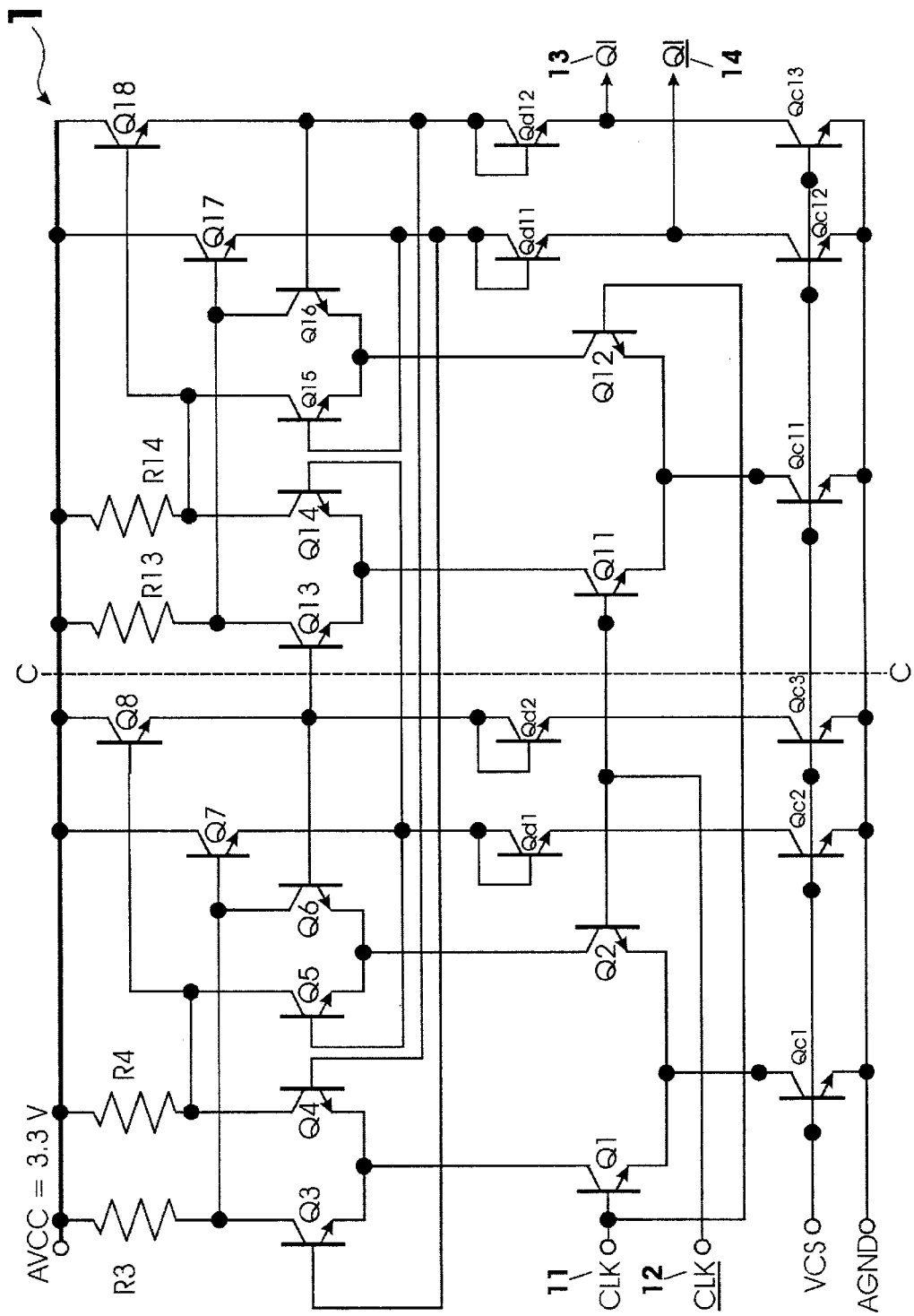
FIG. 1 shows a typical circuit architecture of a Divide-by-2 divider with current mode switching.

FIG. 1 shows a typical circuit architecture of a Divide-by-2 DIVIDER 1 with current mode switching using a number of Bipolar transistors as the active switching elements. They are:

Qc1, Qc2, Qc3.

Q1, Q2, ..., Q8.

Qd1, Qd2.

Qc11, Qc12, ..., Qc13.

Q11, Q12, ..., Q18.

Qd11, Qd12.

In this exemplary illustration the supply voltage AVCC is shown to be 3.3 Volt although other values could be used just as well, for example 1.8 Volt. AGND designates "analog ground" and VCS is a bias voltage applied to the bases of transistors Qc1, Qc2, Qc3, Qc11, Qc12 and Qc13 to set up a corresponding amount of emitter current flowing through them. For those skilled in the art, the DIVIDER 1 can be seen to consist of two latches joined together at interface C—C and having a set of global feedback connections to implement the Divide-by-2 function. One of the critical functional building blocks of the DIVIDER 1 is an emitter coupled difference amplifier whose architecture is well known in the art (see Electronic Circuits Discrete and Integrated—Donald Schilling and Charles Belove. Publisher and date: McGraw-Hill Book Company, 1979, P. 304 to P. 305). For example, one of the difference amplifiers consists of the following circuit components:

transistors Q1, Q3 and Q4.

resistors R3 and R4.

Topologically this DIVIDER 1 circuit is quite similar to a DIVIDER circuit of Reference 1 implemented in CMOS technology (see FIG. 1 of Reference 1) except for the necessary addition of the following emitter follower transistors:

Qc2, Qc3, Qd1, Qd2, Q7 and Q8.

Figure 2A:
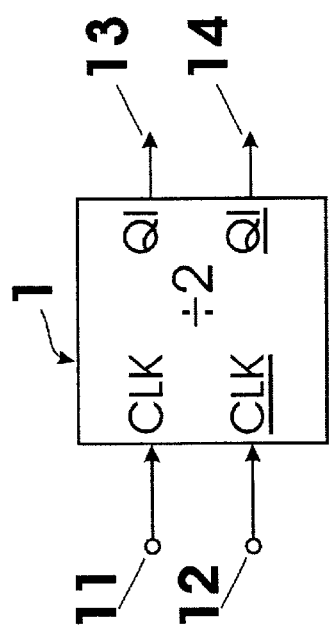
FIG. 2A shows a logic functional block representation of the Divide-by-2 divider shown in FIG. 1.

Qc12, Qc13, Qd11, Qd12, Q17 and Q18.

within the latches to take care of the requirement of base current in an operating Bipolar transistor. Through DIVIDER 1, the frequency of a differential signal between CLK 11 and CLK 12 will be divided in half as the differential signal between QI 13 and QI 14. Also, this type of circuitry is manufacturable with a Bipolar or a BiCMOS IC wafer process. Additionally, if DIVIDER 1 could be quantitatively designed to provide a high quality signal output at a high CLK frequency, such as 10 GHz for OC-192 or 40 GHz for OC-768 communication, then DIVIDER 1 can be used as one of the fundamental building blocks of a low cost optical switch for an optical network. For convenience, the associated logic functional block representation is shown in FIG. 2A.

Figure 2B:
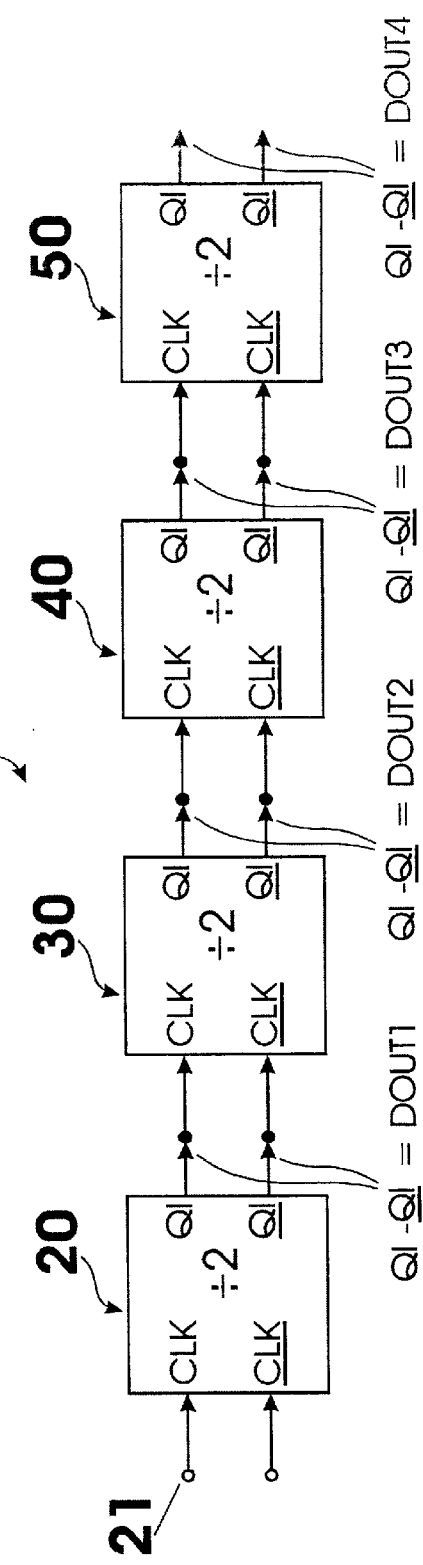
FIG. 2B is a logic functional block diagram of a typical Divide-by-16 divider using the Divide-by-2 divider from FIG. 1.

FIG. 2B is a logic functional block diagram of a typical Divide-by-16 DIVIDER 60 using the Divide-by-2 divider from FIG. 1 as its logic building block. Specifically, the replicated logic building blocks are labeled as DIVIDER 20, DIVIDER 30, DIVIDER 40 and DIVIDER 50. For those skilled in the art, it can be easily seen that the frequency of INPUT CLOCK 21 gets divided by two(2) as differential signal Q-Q=DOUT1 at the output of DIVIDER 20. Likewise, the frequency of INPUT CLOCK 21 gets divided by four(4) as differential signal Q-Q=DOUT2 at the output of DIVIDER 30. The frequency of INPUT CLOCK 21 gets divided by eight(8) as differential signal Q-Q=DOUT3 at the output of DIVIDER 40. Finally, the frequency of INPUT CLOCK 21 gets divided by sixteen(16) as differential signal Q-Q=DOUT4 at the output of DIVIDER 50.

However, the just described circuit architecture can be quantitatively adjusted with different quantitative designs to realize a new circuit architecture capable of producing higher levels of output signal quality especially suitable for high CLK frequency for optical communications and this will be presently illustrated.

It is well known in the art that, at the IC-design level for a given wafer process, the conductance of a Bipolar transistor is primarily determined by the following parameter:

$$W \times L, \text{ where } W = \text{emitter width and } L = \text{emitter length}.$$

where $W \times L$ is the emitter area for conducting electrical current through the Bipolar transistor. For convenience, the following parameter is defined:

$$\text{Electrically Equivalent Emitter Geometry (EEEG)} = W \times L.$$

As an example, for a dual-base Bipolar transistor made by a BiCMOS SiGe (Silicon Germanium) wafer process of 0.35 $\mu$m geometry and having the following transistor parameters:

$$\text{emitter width } W=0.3 \text{ }\mu\text{m, emitter length } L=1.9 \text{ }\mu\text{m, max AVCC}=3.8 \text{ Volt and } f_T=60 \text{ GHz}$$

the Bipolar transistor has an EEEG=$0.3 \text{ }\mu\text{m} \times 1.9 \text{ }\mu\text{m}=0.57 \text{ }\mu\text{m}^2$ (micron square).

Given the above definition, TABLE 1A shows a tabulated design comparison between a typical practice and the current invention of a first building block of Divide-by-2 DIVIDER 20 for the Divide-by-16 DIVIDER 60 as shown in FIG. 2B. For example, with typical practice, all transistors Q5, Q6, Q7 and Q8 have an EEEG of $1.14 \text{ }\mu\text{m}^2$. On the other hand, with the current invention, transistors Q5 and Q6 both have an EEEG of $2.28 \text{ }\mu\text{m}^2$ while transistors Q7 and Q8 both have an EEEG of $0.57 \text{ }\mu\text{m}^2$, etc.

TABLE 1A

Design of EEEG for DIVIDER 20

| | TYPICAL EEEG (Square micron) | PRACTICE RATIO OF EEEG | CURRENT EEEG (Square micron) | INVENTION RATIO OF EEEG |
|---|---|---|---|---|
| Qc1 | 1.14 | 1.00 | 1.14 | 2.00 |
| Q1 | 1.14 | 1.00 | 0.57 | 1.00 |
| Q2 | 1.14 | 1.00 | 0.57 | 1.00 |
| Q3 | 1.14 | 1.00 | 1.14 | 2.00 |
| Q4 | 1.14 | 1.00 | 1.14 | 2.00 |

TABLE 1A-continued

Design of EEEG for DIVIDER 20

| | TYPICAL EEEG (Square micron) | PRACTICE RATIO OF EEEG | CURRENT EEEG (Square micron) | INVENTION RATIO OF EEEG |
|---|---|---|---|---|
| Q5   | 1.14 | 1.00 | 2.28 | 4.00 |
| Q6   | 1.14 | 1.00 | 2.28 | 4.00 |
| Qc2  | 1.14 | 1.00 | 0.57 | 1.00 |
| Qc3  | 1.14 | 1.00 | 0.57 | 1.00 |
| Q7   | 1.14 | 1.00 | 0.57 | 1.00 |
| Q8   | 1.14 | 1.00 | 0.57 | 1.00 |
| Qc11 | 1.14 | 1.00 | 1.14 | 2.00 |
| Q11  | 1.14 | 1.00 | 0.57 | 1.00 |
| Q12  | 1.14 | 1.00 | 0.57 | 1.00 |
| Q13  | 1.14 | 1.00 | 1.14 | 2.00 |
| Q14  | 1.14 | 1.00 | 1.14 | 2.00 |
| Q15  | 1.14 | 1.00 | 2.28 | 4.00 |
| Q16  | 1.14 | 1.00 | 2.28 | 4.00 |
| Qc12 | 1.14 | 1.00 | 0.57 | 1.00 |
| Qc13 | 1.14 | 1.00 | 0.57 | 1.00 |
| Q17  | 1.14 | 1.00 | 1.14 | 2.00 |
| Q18  | 1.14 | 1.00 | 1.14 | 2.00 |

Notice that the EEEGs of transistors Qd1, Qd2, Qd11 and Qd12 are not included in TABLE 1A. The reason is that the function of these four transistors is a simple level shifting of about 0.7 Volt and their precise EEEG values do not affect the output signal quality of the DIVIDER 1. By the same token, the EEEGs of transistors Qd1, Qd2, Qd11 and Qd12 will be left out of all future tables for simplicity of presentation. For the purpose of explanation, a separate column called "RATIO of EEEG" is further defined to be the simplest possible ratio of EEEGs amongst all the transistors. Thus, for example, the EEEGs for transistors Q5 and Qc2 under current invention are 2.28 $\mu m^2$ and 0.57 $\mu m^2$ respectively. Therefore, the RATIO of EEEG between Q5 and Qc2=2.28 $\mu m^2$: 0.57 $\mu m^2$=4:1, etc.

In this way, the salient characteristics of a quantitative design can be more easily revealed and this is illustrated respectively in TABLE 1B, TABLE 1C and TABLE 1D where a tabulated design comparison between a typical practice and the current invention of a second, a third and a fourth building block of the Divide-by-16 DIVIDER 60 is respectively shown.

TABLE 1B

Design of EEEG for DIVIDER 30

| | TYPICAL EEEG (Square micron) | PRACTICE RATIO OF EEEG | CURRENT EEEG (Square micron) | INVENTION RATIO OF EEEG |
|---|---|---|---|---|
| Qc1  | 0.855 | 1.00 | 0.855 | 1.50 |
| Q1   | 0.855 | 1.00 | 0.57  | 1.00 |
| Q2   | 0.855 | 1.00 | 0.57  | 1.00 |
| Q3   | 0.855 | 1.00 | 1.995 | 3.50 |
| Q4   | 0.855 | 1.00 | 1.995 | 3.50 |
| Q5   | 0.855 | 1.00 | 1.14  | 2.00 |
| Q6   | 0.855 | 1.00 | 1.14  | 2.00 |
| Qc2  | 0.855 | 1.00 | 0.57  | 1.00 |
| Qc3  | 0.855 | 1.00 | 0.57  | 1.00 |
| Q7   | 0.855 | 1.00 | 1.425 | 2.50 |
| Q8   | 0.855 | 1.00 | 1.425 | 2.50 |
| Qc11 | 0.855 | 1.00 | 0.855 | 1.50 |
| Q11  | 0.855 | 1.00 | 0.57  | 1.00 |
| Q12  | 0.855 | 1.00 | 0.57  | 1.00 |
| Q13  | 0.855 | 1.00 | 2.565 | 4.50 |
| Q14  | 0.855 | 1.00 | 2.565 | 4.50 |

TABLE 1B-continued

Design of EEEG for DIVIDER 30

| | TYPICAL EEEG (Square micron) | PRACTICE RATIO OF EEEG | CURRENT EEEG (Square micron) | INVENTION RATIO OF EEEG |
|---|---|---|---|---|
| Q15  | 0.855 | 1.00 | 3.42  | 6.00 |
| Q16  | 0.855 | 1.00 | 3.42  | 6.00 |
| Qc12 | 0.855 | 1.00 | 0.57  | 1.00 |
| Qc13 | 0.855 | 1.00 | 0.57  | 1.00 |
| Q17  | 0.855 | 1.00 | 0.855 | 1.50 |
| Q18  | 0.855 | 1.00 | 0.855 | 1.50 |

TABLE 1C

Design of EEEG for DIVIDER 40

| | TYPICAL EEEG (Square micron) | PRACTICE RATIO OF EEEG | CURRENT EEEG (Square micron) | INVENTION RATIO OF EEEG |
|---|---|---|---|---|
| Qc1  | 0.57 | 1.00 | 0.57   | 1.00 |
| Q1   | 0.57 | 1.00 | 0.285  | 0.50 |
| Q2   | 0.57 | 1.00 | 0.285  | 0.50 |
| Q3   | 0.57 | 1.00 | 1.14   | 2.00 |
| Q4   | 0.57 | 1.00 | 1.14   | 2.00 |
| Q5   | 0.57 | 1.00 | 1.425  | 2.50 |
| Q6   | 0.57 | 1.00 | 1.425  | 2.50 |
| Qc2  | 0.57 | 1.00 | 0.285  | 0.50 |
| Qc3  | 0.57 | 1.00 | 0.285  | 0.50 |
| Q7   | 0.57 | 1.00 | 0.1425 | 0.25 |
| Q8   | 0.57 | 1.00 | 0.1425 | 0.25 |
| Qc11 | 0.57 | 1.00 | 0.57   | 1.00 |
| Q11  | 0.57 | 1.00 | 0.285  | 0.50 |
| Q12  | 0.57 | 1.00 | 0.285  | 0.50 |
| Q13  | 0.57 | 1.00 | 2.85   | 5.00 |
| Q14  | 0.57 | 1.00 | 2.85   | 5.00 |
| Q15  | 0.57 | 1.00 | 1.14   | 2.00 |
| Q16  | 0.57 | 1.00 | 1.14   | 2.00 |
| Qc12 | 0.57 | 1.00 | 0.285  | 0.50 |
| Qc13 | 0.57 | 1.00 | 0.285  | 0.50 |
| Q17  | 0.57 | 1.00 | 2.28   | 4.00 |
| Q18  | 0.57 | 1.00 | 2.28   | 4.00 |

TABLE 1D

Design of EEEG for DIVIDER 50

| | TYPICAL EEEG (Square micron) | PRACTICE RATIO OF EEEG | CURRENT EEEG (Square micron) | INVENTION RATIO OF EEEG |
|---|---|---|---|---|
| Qc1  | 0.285 | 1.00 | 0.285  | 0.50 |
| Q1   | 0.285 | 1.00 | 0.1425 | 0.25 |
| Q2   | 0.285 | 1.00 | 0.1425 | 0.25 |
| Q3   | 0.285 | 1.00 | 3.42   | 6.00 |
| Q4   | 0.285 | 1.00 | 3.42   | 6.00 |
| Q5   | 0.285 | 1.00 | 3.99   | 7.00 |
| Q6   | 0.285 | 1.00 | 3.99   | 7.00 |
| Qc2  | 0.285 | 1.00 | 0.285  | 0.50 |
| Qc3  | 0.285 | 1.00 | 0.285  | 0.50 |
| Q7   | 0.285 | 1.00 | 0.1425 | 0.25 |
| Q8   | 0.285 | 1.00 | 0.1425 | 0.25 |
| Qc11 | 0.285 | 1.00 | 0.285  | 0.50 |
| Q11  | 0.285 | 1.00 | 0.1425 | 0.25 |
| Q12  | 0.285 | 1.00 | 0.1425 | 0.25 |
| Q13  | 0.285 | 1.00 | 1.995  | 3.50 |
| Q14  | 0.285 | 1.00 | 1.995  | 3.50 |
| Q15  | 0.285 | 1.00 | 1.71   | 3.00 |
| Q16  | 0.285 | 1.00 | 1.71   | 3.00 |
| Qc12 | 0.285 | 1.00 | 0.285  | 0.50 |

TABLE 1D-continued

Design of EEEG for DIVIDER 50

| | TYPICAL EEEG (Square micron) | PRACTICE RATIO OF EEEG | CURRENT EEEG (Square micron) | INVENTION RATIO OF EEEG |
|---|---|---|---|---|
| Qc13 | 0.285 | 1.00 | 0.285 | 0.50 |
| Q17 | 0.285 | 1.00 | 3.42 | 6.00 |
| Q18 | 0.285 | 1.00 | 3.42 | 6.00 |

Referring now to TABLEs 2–5, there are further illustrated the difference in quantitative designs of the building blocks between the typical practice and the current invention with respect to the EEEG and the ratio of EEEG of selected transistors. For example, the EEEG and ratio of EEEG of transistor Qc1 under typical practice would form the following TABLE-2:

TABLE 2

EEEG of transistor Qc1 - typical practice

| | DIVIDER 20 | DIVIDER 30 | DIVIDER 40 | DIVIDER 50 |
|---|---|---|---|---|
| EEEG ($\mu m^2$) | 1.14 | 0.855 | 0.57 | 0.285 |
| Ratio of EEEG | 1.00 | 1.00 | 1.00 | 1.00 |

However, the corresponding EEEG and ratio of EEEG of transistor Qc1 under the current invention would form the following TABLE-3:

TABLE 3

EEEG of transistor Qc1 - current invention

| | DIVIDER 20 | DIVIDER 30 | DIVIDER 40 | DIVIDER 50 |
|---|---|---|---|---|
| EEEG ($\mu m^2$) | 1.14 | 0.855 | 0.57 | 0.285 |
| Ratio of EEEG | 2.00 | 1.50 | 1.00 | 0.50 |

For another example, the EEEG and ratio of EEEG of transistor Q8 under typical practice would form the following TABLE-4:

TABLE 4

EEEG of transistor Q8 - typical practice

| | DIVIDER 20 | DIVIDER 30 | DIVIDER 40 | DIVIDER 50 |
|---|---|---|---|---|
| EEEG ($\mu m^2$) | 1.14 | 0.855 | 0.57 | 0.285 |
| Ratio of EEEG | 1.00 | 1.00 | 1.00 | 1.00 |

However, the corresponding EEEG and ratio of EEEG of transistor Q8 under the current invention would form the following TABLE-5:

TABLE 5

EEEG of transistor Q8 - current invention

| | DIVIDER 20 | DIVIDER 30 | DIVIDER 40 | DIVIDER 50 |
|---|---|---|---|---|
| EEEG ($\mu m^2$) | 0.57 | 1.425 | 0.1425 | 0.1425 |
| Ratio of EEEG | 1.00 | 2.50 | 0.25 | 0.25 |

As revealed by TABLE-2, while there is a general trend of decreasing EEEG of transistor Qc1 going from DIVIDER 20 to DIVIDER 50, the respective ratios of EEEG, however, remain unchanged at the value of 1 throughout DIVIDER 20 to DIVIDER 50. Likewise, TABLE-4 reveals that, while there is also a general trend of decreasing EEEG of transistor Q8 going from DIVIDER 20 to DIVIDER 50, the ratios of EEEG remain unchanged at the value of 1 throughout DIVIDER 20 to DIVIDER 50. In fact, a systematic comparison of the EEEGs and the ratios of EEEG of the rest of the transistors of the typical practice reveals the same observation. It is therefore apparent that, with typical practice, the quantitative design of all the individual building blocks of DIVIDER 60 is essentially similar. It is understood by those skilled in the art that the general trend of decreasing EEEG of all transistors going from DIVIDER 20 to DIVIDER 50 is because, as the CLK frequency gets progressively divided down, the lowered speed of circuit operation would only need correspondingly lowered level of operating current with reduced value of EEEG to reduce power consumption.

However, referring to the building blocks of the current invention as shown in TABLE-3, which reveals that, while there is a similar general trend of decreasing EEEG of transistor Qc1 going from DIVIDER 20 to DIVIDER 50, none of the respective ratios of EEEG shares a single designed value common to all the individual building blocks of DIVIDER 60 throughout DIVIDER 20 to DIVIDER 50. Likewise, TABLE-5 reveals that, while there is a general trend of decreasing EEEG of transistor Q8 going from DIVIDER 20 to DIVIDER 50, none of the respective ratios of EEEG of transistor Q8 shares a single designed value common to all the individual building blocks of DIVIDER 60 throughout DIVIDER 20 to DIVIDER 50. In fact, a systematic comparison of the EEEGs and the ratios of EEEG of the rest of the transistors with the current invention reveals the same observation. Therefore, with the current invention, the quantitative designs of each of the individual building blocks of DIVIDER 60 are different from the other building blocks. For those skilled in the art, the current invention discloses a unique design feature distinctly different from that known to the typical practice in view of the fact that the current invention requires all the individual building blocks of DIVIDER 60 to be designed differently to achieve a much higher level of output signal quality, to be presently illustrated, that is otherwise unachievable by the art taught by the typical practice.

TABLE 1E is a tabulated overall design comparison, in terms of the ratio of EEEG, between a typical practice and the current invention of the Divide-by-16 DIVIDER 60 as shown in FIG. 2B. It is clearly seen that, while the qualitative design of all the individual building blocks of DIVIDER 60 according to the typical practice is rather similar, the quantitative design of each building block of DIVIDER 60 according to the current invention is different because each of the building blocks needs to be individually adjusted to achieve a much higher level of output signal quality in the presence of such undesirable deteriorating effects like output loading and electrical interaction between adjacent building blocks. Typically, these effects become

TABLE 1E

Overview of Design of EEEG for DIVIDER 60

| | DIV 20 | DIV 30 | DIV 40 | DIV 50 |
|---|---|---|---|---|
| | TYPICAL PRACTICE RATIO OF EEEG | | | |
| Qc1 | 1.00 | 1.00 | 1.00 | 1.00 |
| Q1 | 1.00 | 1.00 | 1.00 | 1.00 |
| Q2 | 1.00 | 1.00 | 1.00 | 1.00 |
| Q3 | 1.00 | 1.00 | 1.00 | 1.00 |
| Q4 | 1.00 | 1.00 | 1.00 | 1.00 |
| Q5 | 1.00 | 1.00 | 1.00 | 1.00 |
| Q6 | 1.00 | 1.00 | 1.00 | 1.00 |
| Qc2 | 1.00 | 1.00 | 1.00 | 1.00 |
| Qc3 | 1.00 | 1.00 | 1.00 | 1.00 |
| Q7 | 1.00 | 1.00 | 1.00 | 1.00 |
| Q8 | 1.00 | 1.00 | 1.00 | 1.00 |
| Qc11 | 1.00 | 1.00 | 1.00 | 1.00 |
| Q11 | 1.00 | 1.00 | 1.00 | 1.00 |
| Q12 | 1.00 | 1.00 | 1.00 | 1.00 |
| Q13 | 1.00 | 1.00 | 1.00 | 1.00 |
| Q14 | 1.00 | 1.00 | 1.00 | 1.00 |
| Q15 | 1.00 | 1.00 | 1.00 | 1.00 |
| Q16 | 1.00 | 1.00 | 1.00 | 1.00 |
| Qc12 | 1.00 | 1.00 | 1.00 | 1.00 |
| Qc13 | 1.00 | 1.00 | 1.00 | 1.00 |
| Q17 | 1.00 | 1.00 | 1.00 | 1.00 |
| Q18 | 1.00 | 1.00 | 1.00 | 1.00 |
| | CURRENT INVENTION RATIO OF EEEG | | | |
| Qc1 | 2.00 | 1.50 | 1.00 | 0.50 |
| Q1 | 1.00 | 1.00 | 0.50 | 0.25 |
| Q2 | 1.00 | 1.00 | 0.50 | 0.25 |
| Q3 | 2.00 | 3.50 | 2.00 | 6.00 |
| Q4 | 2.00 | 3.50 | 2.00 | 6.00 |
| Q5 | 4.00 | 2.00 | 2.5 | 7 |
| Q6 | 4.00 | 2.00 | 2.5 | 7 |
| Qc2 | 1.00 | 1.00 | 0.50 | 0.50 |
| Qc3 | 1.00 | 1.00 | 0.50 | 0.50 |
| Q7 | 1.00 | 2.50 | 0.25 | 0.25 |
| Q8 | 1.00 | 2.50 | 0.25 | 0.25 |
| Qc11 | 2.00 | 1.50 | 1.00 | 0.50 |
| Q11 | 1.00 | 1.00 | 0.50 | 0.25 |
| Q12 | 1.00 | 1.00 | 0.50 | 0.25 |
| Q13 | 2.00 | 4.50 | 5.00 | 3.50 |
| Q14 | 2.00 | 4.50 | 5.00 | 3.50 |
| Q15 | 4.00 | 6.00 | 2 | 3 |
| Q16 | 4.00 | 6.00 | 2 | 3 |
| Qc12 | 1.00 | 1.00 | 0.50 | 0.50 |
| Qc13 | 1.00 | 1.00 | 0.50 | 0.50 |
| Q17 | 2.00 | 1.50 | 4.00 | 6.00 |
| Q18 | 2.00 | 1.50 | 4.00 | 6.00 | especially pronounced at high CLK frequencies such as those for high speed optical communications presented here. Thus, FIG. 3A compares the output signal ripple, DOUT1, between a typical practice and the current invention of the first building block of Divide-by-2 DIVIDER 20 for the Divide-by-16 DIVIDER 60 driven with an INPUT CLOCK 21 of frequency f(CLK)=10 GHz. Notice that, with typical practice, FIG. 3A-1, signal ripple 61 is more than 100 mV P-P while with the current invention, FIG. 3A-2, the corresponding signal ripple is hardly visible. This is an important improvement in the data communication industry as it requires that this signal ripple to be as small as possible.

Similarly, FIG. 3B, FIG. 3C and FIG. 3D respectively compares the output signal ripple, DOUT2, DOUT3 and DOUT4, between a typical practice and the current invention of the building blocks of DIVIDER 30, DIVIDER 40 and DIVIDER 50 for the Divide-by-16 DIVIDER 60 driven with an INPUT CLOCK 21 of the same frequency f(CLK)= 10 GHz. The following improvement of signal ripple with the current invention are observed:

DIVIDER 30: From 250 mV P-P to 20 mV P-P (FIG. 3B-1 and FIG. 3B-2, signal ripple 63 vs. signal ripple 64).

DIVIDER 40: From 220 mV P-P to 30 mV P-P (FIG. 3C-1 and FIG. 3C-2, signal ripple 65 vs. signal ripple 66).

DIVIDER 50: From 270 mV P-P to 30 mV P-P (FIG. 3D-1 and FIG. 3D-2, signal ripple 67 vs. signal ripple 68).

Figure 4:
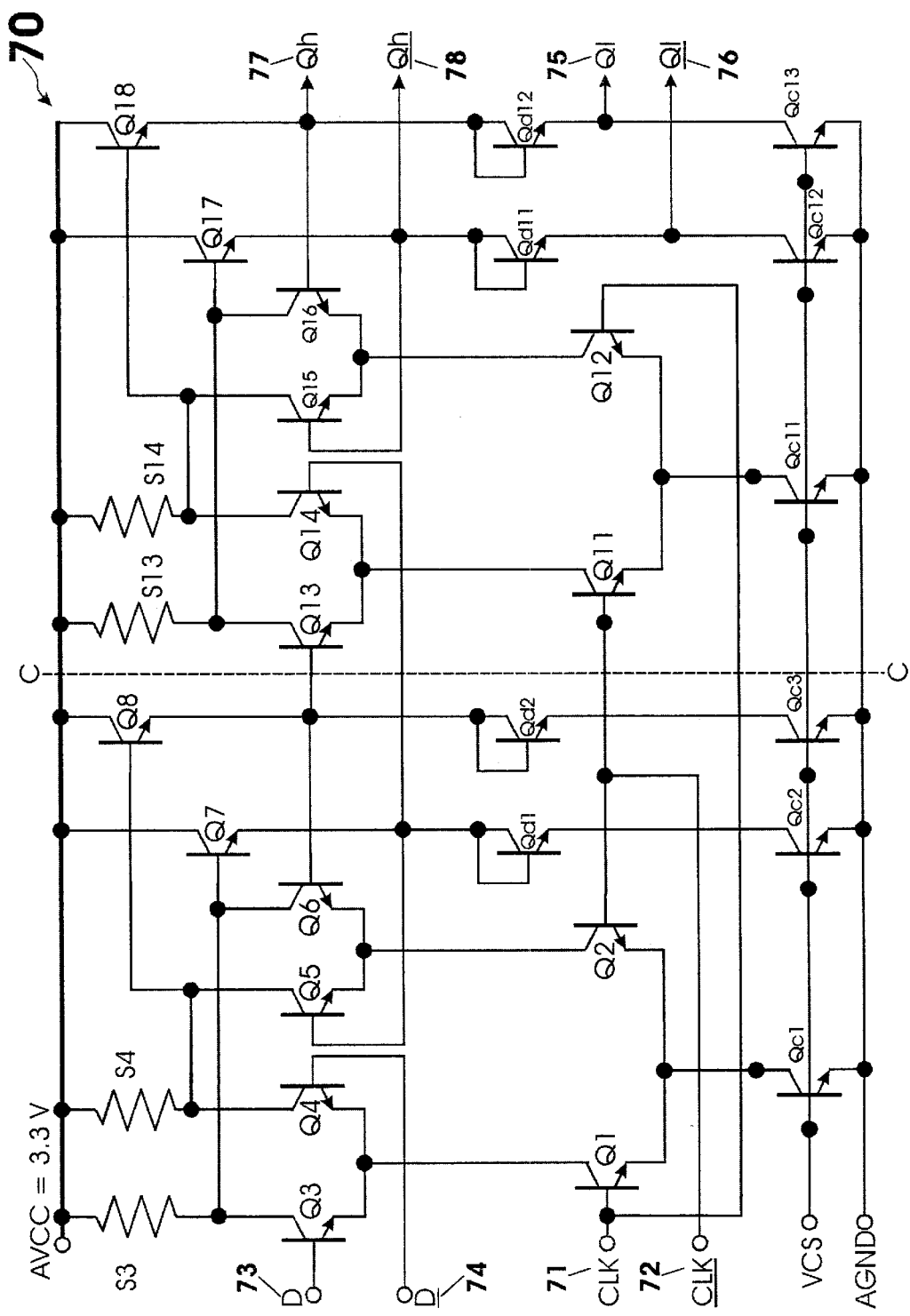
FIG. 4 shows a typical circuit architecture of an MS-DFF with current mode switching.
Figure 5A:
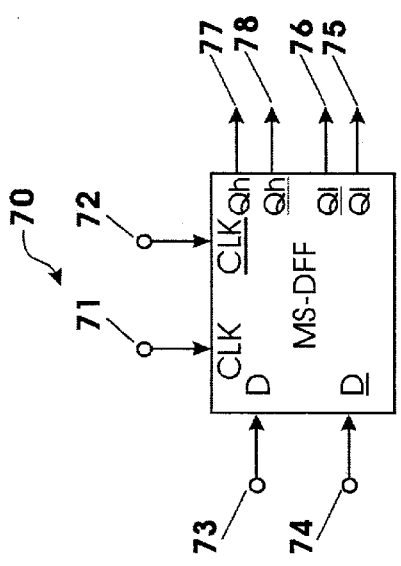
FIG. 5A shows a logic functional block representation of the MS-DFF as shown in FIG. 4.

Another exemplary case of application of the current invention is illustrated from FIG. 4 to FIG.-6. FIG. 4 and FIG. 5A show a typical circuit architecture of an MS-DFF 70 with current mode switching and its associated logic functional block representation. In this exemplary case the supply voltage AVCC is shown to be 3.3 Volt although other values could be used just as well, for example 1.8 Volt. The input clock signals are CLK 71 and CLK 72. The input data signals are D 73 and D 74. The output data signals are Q 75, Q 76, Qh 77 and Qh 78. The various Bipolar transistors are designated as Qc1, Q1, Q2, . . . , and Q18 just like in FIG. 1. For those skilled in the art, this circuitry is also manufacturable with a Bipolar or a BiCMOS IC wafer process. If MS-DFF 70 can also be quantitatively designed to provide a high quality signal output at a high CLK frequency, such as 40 GHz for OC-768 communication, then MS-DFF 70 can also be used as one of the fundamental building blocks of a low cost optical switch for an optical network.

Figure 5B:
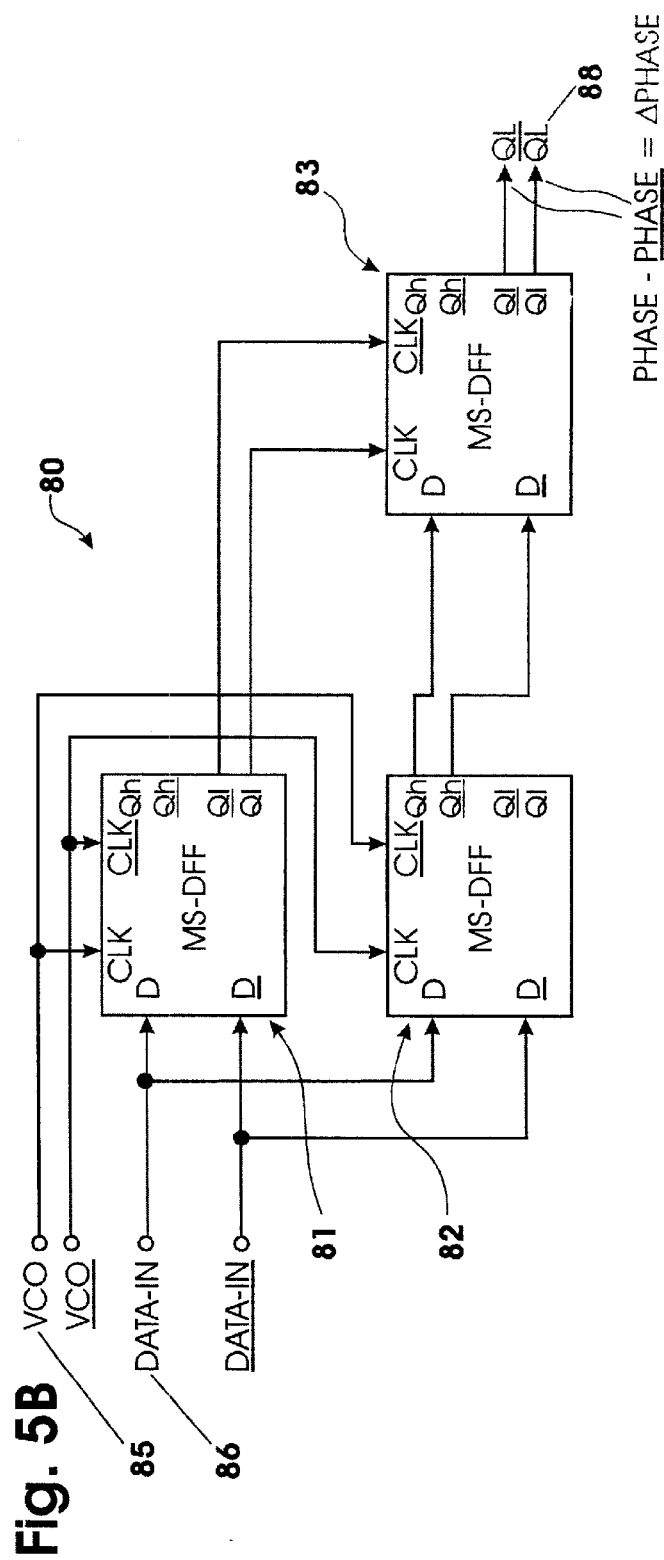
FIG. 5B is a logic functional block diagram of a typical BBPD using the MS-DFF from FIG. 4 as its logic building block.

FIG. 5B is a logic functional block diagram of a typical BBPD 80 using the MS-DFF 70 from FIG. 4 as its logic building block. Specifically, the replicated logic building blocks are labeled as MS-DFF 81, MS-DFF 82 and MS-DFF 83. The input signals include VCO 85 and DATA-IN 86. The output signals include PHASE 88 and its logic complement. For those skilled in the art, it can be easily seen that the logic state of PHASE 88 will change according to the phase relationship of leading or lagging between the two input signals VCO 85 and DATA-IN 86. For convenience, the following differential signal is also defined:

$$\Delta PHASE = PHASE - \underline{PHASE}.$$

Like before, while using the same circuit architecture of an MS-DFF 70 with current mode switching, different quantitative design of BBPD 80 also yields quite different level of output signal quality especially for high VCO frequency as in optical communications. This is illustrated, in a manner similar to the first exemplary case of DIVIDER 60, with TABLE 2A, TABLE 2B, TABLE 2C and TABLE 2D.

TABLE 2A

Design of EEEG for MS-DFF 81

| | TYPICAL EEEG (Square micron) | PRACTICE RATIO OF EEEG | CURRENT EEEG (Square micron) | INVENTION RATIO OF EEEG |
|---|---|---|---|---|
| Qc1 | 1.14 | 1.00 | 1.14 | 2.00 |
| Q1 | 1.14 | 1.00 | 0.57 | 1.00 |
| Q2 | 1.14 | 1.00 | 0.57 | 1.00 |
| Q3 | 1.14 | 1.00 | 1.14 | 2.00 |
| Q4 | 1.14 | 1.00 | 1.14 | 2.00 |
| Q5 | 1.14 | 1.00 | 1.995 | 3.50 |
| Q6 | 1.14 | 1.00 | 1.995 | 3.50 |
| Qc2 | 1.14 | 1.00 | 0.57 | 1.00 |
| Qc3 | 1.14 | 1.00 | 0.57 | 1.00 |
| Q7 | 1.14 | 1.00 | 1.14 | 2.00 |
| Q8 | 1.14 | 1.00 | 1.14 | 2.00 |
| Qc11 | 1.14 | 1.00 | 1.14 | 2.00 |
| Q11 | 1.14 | 1.00 | 0.57 | 1.00 |

TABLE 2A-continued

Design of EEEG for MS-DFF 81

| | TYPICAL EEEG (Square micron) | PRACTICE RATIO OF EEEG | CURRENT EEEG (Square micron) | INVENTION RATIO OF EEEG |
|---|---|---|---|---|
| Q12 | 1.14 | 1.00 | 0.57 | 1.00 |
| Q13 | 1.14 | 1.00 | 1.995 | 3.50 |
| Q14 | 1.14 | 1.00 | 1.995 | 3.50 |
| Q15 | 1.14 | 1.00 | 1.14 | 2.00 |
| Q16 | 1.14 | 1.00 | 1.14 | 2.00 |
| Qc12 | 1.14 | 1.00 | 0.57 | 1.00 |
| Qc13 | 1.14 | 1.00 | 0.57 | 1.00 |
| Q17 | 1.14 | 1.00 | 1.425 | 2.50 |
| Q18 | 1.14 | 1.00 | 1.425 | 2.50 |

TABLE 2B

Design of EEEG for MS-DFF 82

| | TYPICAL EEEG (Square micron) | PRACTICE RATIO OF EEEG | CURRENT EEEG (Square micron) | INVENTION RATIO OF EEEG |
|---|---|---|---|---|
| Qc1 | 1.14 | 1.00 | 1.14 | 2.00 |
| Q1 | 1.14 | 1.00 | 0.57 | 1.00 |
| Q2 | 1.14 | 1.00 | 0.57 | 1.00 |
| Q3 | 1.14 | 1.00 | 0.885 | 1.50 |
| Q4 | 1.14 | 1.00 | 0.885 | 1.50 |
| Q5 | 1.14 | 1.00 | 1.995 | 3.50 |
| Q6 | 1.14 | 1.00 | 1.995 | 3.50 |
| Qc2 | 1.14 | 1.00 | 0.57 | 1.00 |
| Qc3 | 1.14 | 1.00 | 0.57 | 1.00 |
| Q7 | 1.14 | 1.00 | 1.14 | 2.00 |
| Q8 | 1.14 | 1.00 | 1.14 | 2.00 |
| Qc11 | 1.14 | 1.00 | 1.14 | 2.00 |
| Q11 | 1.14 | 1.00 | 0.57 | 1.00 |
| Q12 | 1.14 | 1.00 | 0.57 | 1.00 |
| Q13 | 1.14 | 1.00 | 0.885 | 1.50 |
| Q14 | 1.14 | 1.00 | 0.885 | 1.50 |
| Q15 | 1.14 | 1.00 | 1.995 | 3.50 |
| Q16 | 1.14 | 1.00 | 1.995 | 3.50 |
| Qc12 | 1.14 | 1.00 | 0.57 | 1.00 |
| Qc13 | 1.14 | 1.00 | 0.57 | 1.00 |
| Q17 | 1.14 | 1.00 | 0.57 | 1.00 |
| Q18 | 1.14 | 1.00 | 0.57 | 1.00 |

TABLE 2C

Design of EEEG for MS-DFF 83

| | TYPICAL EEEG (Square micron) | PRACTICE RATIO OF EEEG | CURRENT EEEG (Square micron) | INVENTION RATIO OF EEEG |
|---|---|---|---|---|
| Qc1 | 0.57 | 1.00 | 0.57 | 1.00 |
| Q1 | 0.57 | 1.00 | 0.285 | 0.50 |
| Q2 | 0.57 | 1.00 | 0.285 | 0.50 |
| Q3 | 0.57 | 1.00 | 1.14 | 2.00 |
| Q4 | 0.57 | 1.00 | 1.14 | 2.00 |
| Q5 | 0.57 | 1.00 | 1.71 | 3.00 |
| Q6 | 0.57 | 1.00 | 1.71 | 3.00 |
| Qc2 | 0.57 | 1.00 | 0.57 | 1.00 |
| Qc3 | 0.57 | 1.00 | 0.57 | 1.00 |
| Q7 | 0.57 | 1.00 | 0.285 | 0.50 |
| Q8 | 0.57 | 1.00 | 0.285 | 0.50 |
| Qc11 | 0.57 | 1.00 | 0.57 | 1.00 |
| Q11 | 0.57 | 1.00 | 0.285 | 0.50 |
| Q12 | 0.57 | 1.00 | 0.285 | 0.50 |
| Q13 | 0.57 | 1.00 | 1.14 | 2.00 |
| Q14 | 0.57 | 1.00 | 1.14 | 2.00 |

TABLE 2C-continued

Design of EEEG for MS-DFF 83

| | TYPICAL EEEG (Square micron) | PRACTICE RATIO OF EEEG | CURRENT EEEG (Square micron) | INVENTION RATIO OF EEEG |
|---|---|---|---|---|
| Q15 | 0.57 | 1.00 | 1.71 | 3.00 |
| Q16 | 0.57 | 1.00 | 1.71 | 3.00 |
| Qc12 | 0.57 | 1.00 | 0.57 | 1.00 |
| Qc13 | 0.57 | 1.00 | 0.57 | 1.00 |
| Q17 | 0.57 | 1.00 | 1.995 | 3.50 |
| Q18 | 0.57 | 1.00 | 1.995 | 3.50 |

TABLE 2D

Overview of Design of EEEG for BBPD 80

| | MS-DFF 81 | MS-DFF 82 | MS-DFF 83 |
|---|---|---|---|
| TYPICAL PRACTICE RATIO OF EEEG | | | |
| Qc1 | 1.00 | 1.00 | 1.00 |
| Q1 | 1.00 | 1.00 | 1.00 |
| Q2 | 1.00 | 1.00 | 1.00 |
| Q3 | 1.00 | 1.00 | 1.00 |
| Q4 | 1.00 | 1.00 | 1.00 |
| Q5 | 1.00 | 1.00 | 1.00 |
| Q6 | 1.00 | 1.00 | 1.00 |
| Qc2 | 1.00 | 1.00 | 1.00 |
| Qc3 | 1.00 | 1.00 | 1.00 |
| Q7 | 1.00 | 1.00 | 1.00 |
| Q8 | 1.00 | 1.00 | 1.00 |
| Qc11 | 1.00 | 1.00 | 1.00 |
| Q11 | 1.00 | 1.00 | 1.00 |
| Q12 | 1.00 | 1.00 | 1.00 |
| Q13 | 1.00 | 1.00 | 1.00 |
| Q14 | 1.00 | 1.00 | 1.00 |
| Q15 | 1.00 | 1.00 | 1.00 |
| Q16 | 1.00 | 1.00 | 1.00 |
| Qc12 | 1.00 | 1.00 | 1.00 |
| Qc13 | 1.00 | 1.00 | 1.00 |
| Q17 | 1.00 | 1.00 | 1.00 |
| Q18 | 1.00 | 1.00 | 1.00 |
| CURRENT INVENTION RATIO OF EEEG | | | |
| Qc1 | 2.00 | 2.00 | 1.00 |
| Q1 | 1.00 | 1.00 | 0.50 |
| Q2 | 1.00 | 1.00 | 0.50 |
| Q3 | 2.00 | 1.50 | 2.00 |
| Q4 | 2.00 | 1.50 | 2.00 |
| Q5 | 3.50 | 3.50 | 3.00 |
| Q6 | 3.50 | 3.50 | 3.00 |
| Qc2 | 1.00 | 1.00 | 1.00 |
| Qc3 | 1.00 | 1.00 | 1.00 |
| Q7 | 2.00 | 2.00 | 0.50 |
| Q8 | 2.00 | 2.00 | 0.50 |
| Qc11 | 2.00 | 2.00 | 1.00 |
| Q11 | 1.00 | 1.00 | 0.50 |
| Q12 | 1.00 | 1.00 | 0.50 |
| Q13 | 3.50 | 1.50 | 2.00 |
| Q14 | 3.50 | 1.50 | 2.00 |
| Q15 | 2.00 | 3.50 | 3.00 |
| Q16 | 2.00 | 3.50 | 3.00 |
| Qc12 | 1.00 | 1.00 | 1.00 |
| Qc13 | 1.00 | 1.00 | 1.00 |
| Q17 | 2.50 | 1.00 | 3.50 |
| Q18 | 2.50 | 1.00 | 3.50 |

Thus, while the quantitative design of all the individual building blocks of BBPD 80 is similar with typical practice, the quantitative design of each building block of BBPD 80 is individually adjusted with the current invention to achieve a much higher level of output signal quality in the presence of such deteriorating effects like output loading and interaction between functionally connected building blocks. Again, these effects tend to become especially pronounced at high VCO frequencies such as those for high speed optical communications presented here.

Figure 6A:
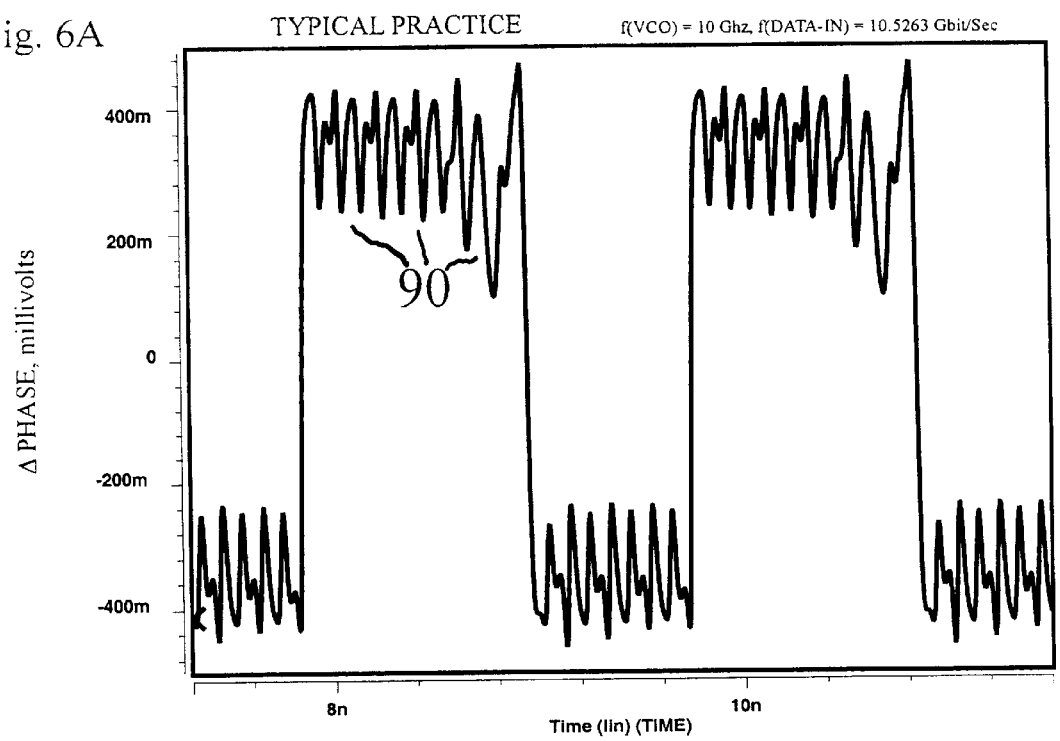
FIG. 6A and FIG. 6B compare the output signal ripple between a typical practice and the current invention of the BBPD in FIG. 5B.
Figure 6B:
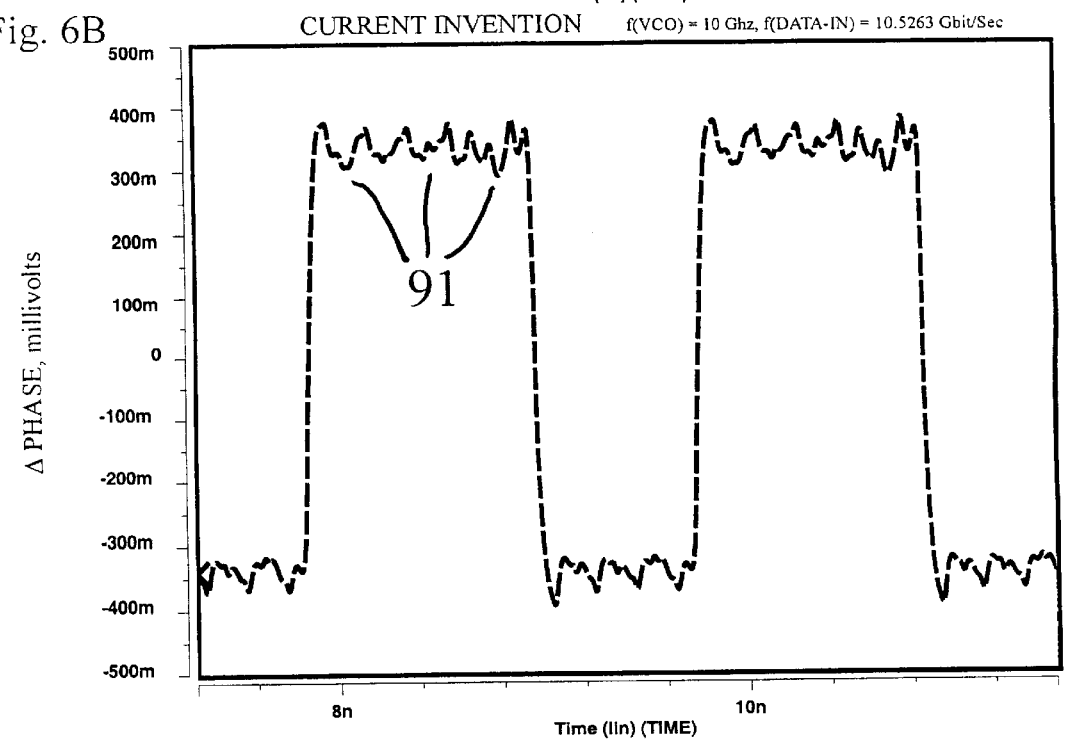

FIG. 6 compares the output signal ripple, APHASE, between a typical practice and the current invention BBPD 80 with a VCO 85 frequency f(CLK)=10 GHz and a DATA-IN 86 data rate f(DATA-IN)=10.5263 Gbit/Sec. In FIG. 6A, the magnitude of signal ripple 90 of the typical practice has reached an excessive and obviously unacceptable level of 375 mV P-P in the presence of a logic signal swing of 800 mV. In fact, to filter out such a high level of signal ripple from ΔPHASE, the typical practice would require such a large filter capacitor that, due to its excessive size, needs to be implemented off-chip further increasing the overall system size and cost. However, with the current invention, the magnitude of signal ripple 91 is now, as shown in FIG. 6B, drastically reduced to about 90 mV which can be easily filtered out.

Another important remark for the current invention is that, while the preferred embodiments are all illustrated with systematic adjustment of the active Bipolar transistors of the individual building blocks, in reality the value of many or all of the associated passive circuit elements may be correspondingly adjusted as well. For example, in FIG. 1, the resistors R3, R4, R13 and R14 can all be individually adjusted for each building block of DIVIDER 60 in FIG. 2B although these adjustments are not illustrated for simplicity of explanation. For another example, in FIG. 4, the resistors S3, S4, S13 and S14 can all be individually adjusted for each building block of BBPD 80 in FIG. 5B although these adjustments are also not illustrated for the same reason.

As described with two exemplary cases of application, by systematically adjusting the Electrically Equivalent Emitter Geometry of some or all of the Bipolar transistors of the individual building blocks of a multiple building block circuit, the corresponding quality of output signal is significantly improved. This is especially important for applications with high clock frequency such as in optical communications where such effects of output loading and interaction between connected functional building blocks tend to become highly pronounced. The invention has been described using exemplary preferred embodiments. However, for those skilled in this field, the preferred embodiments can be easily adapted and modified to suit additional applications without departing from the spirit and scope of this invention. For example, it should become clear by now that the scope and operability of the current invention, while having been illustrated with a 0.35 μm BiCMOS SiGe wafer process, are independent of these specifics of IC process and geometry. In fact, the various advantages of the current invention are scalable with such current and future advancement of the IC process and geometry into 0.25 μm, 0.18 μm and 0.09 μm, et. with a corresponding increase of data rate well beyond 40 Gbit/sec. Some of the related applications include, but without limitation to, Optical communication at 10 Gbit/sec (OC192) and 40 Gbit/sec (OC768) data rate, Gigabit Ethernet, 10 Gigabit Ethernet, Blue Tooth technology (2.4 GHz) and wirless LAN (5.2 GHz). At such a high data rate, the hardware infrastructure for a multimedia information super highway is also enable.

Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed are the following:

1. An electronic circuit system for signal processing comprising:
   a plurality of individually adjustable building blocks wherein each of the building blocks having a similar circuit topology that further comprises:
      an interconnected set of passive components and a number of Bipolar transistors wherein each of said Bipolar transistors is provided with an adjustable value of an Electrically Equivalent Emitter Geometry (EEEG), defined as an emitter area for conducting electrical current through the respective Bipolar transistor; and
      a vector quantity, called a Common Factor (CF), being defined as a vector ratio between the set of EEEGs of said number of Bipolar transistors
   whereby each of the plurality of individually adjustable building blocks is so adjusted in a manner so that the CF of each of the plurality of individually adjustable building blocks do not share an identical vector value to achieve a set of desirable output signals with an improved characteristics as compared to a set of output signals produced by another electronic circuit system wherein the CF of each of the plurality of individually adjustable building blocks share an identical vector value.

2. The electronic circuit system according to claim 1 wherein the improved characteristics of said desirable output signals includes minimizing a deteriorating effect caused by interactions amongst two or more of the building blocks at the system level.

3. The electronic circuit system according to claim 1 wherein the improved characteristics of said desirable output signals includes a reduction of the level of output signal ripple.

4. The electronic circuit system according to claim 1 wherein the improved characteristics of said desirable output signals further includes a reduction of the level of output signal jitter.

5. The electronic circuit system according to claim 1 wherein the improved characteristics of said desirable output signals further includes a reduction of the level of unwanted output signal oscillation.

6. The electronic circuit system according to claim 1 wherein the improved characteristics of said desirable output signals further includes increasing an output signal dynamic range.

7. The electronic circuit system according to claim 1 wherein the improved characteristics of said desirable output signals further includes increasing an output signal linearity.

8. The electronic circuit system according to claim 1 wherein the improved characteristics of said desirable output signals further includes increasing the accuracy of an output signal waveform.

9. The electronic circuit system according to claim 1 wherein the improved characteristics of said desirable output signals further includes increasing the accuracy of an output signal phase angle.

10. The electronic circuit system according to claim 1 wherein the electronic circuit system is specifically selected from the group consisting of flip-flops and dividers, registers and counters, memories, timers, application specific logic circuits, Arithmetic and Logic Units (ALU), embedded controllers, microprocessors, digital and analog filters, phase and frequency detectors, frequency synthesizers, frequency synthesizers, multipliers and modulators, multipliers and modulators, multiplexers and demultiplexers, phase-locked loops, data converters, and multi-stage amplifiers.

11. A method of designing an electronic circuit system for signal processing, comprising the steps of:

provideng a plurality of individually adjustable building blocks wherein each of the building blocks has a similar circuit topology that further comprises an interconnected set of passive components and a number of Bipolar transistors;

identifying, for each of said number of Bipolar transistors, an adjustable value of an Electrically Equivalent Emitter Geometry (EEEG), defined as an emitter area for conducting electrical current through the respective Bipolar transistor;

assigning a vector quantity, called a Common Factor (CF), being defined as a vector ratio between the set of EEEGs of said number of Bipolar transistors; and adjusting each of the plurality of individually adjustable building blocks in a manner so that the CF of each of the plurality of individually adjustable building blocks do not share an identical vector value to achieve a set of desirable output signals with an improved characteristics as compared to a set of output signals produced by another electronic circuit system wherein the CF of each of the plurality of individually adjustable building blocks share an identical vector value.

12. The method of designing an electronic circuit system according to claim 11 wherein the improved characteristics of said desirable output signals includes minimizing a deteriorating effect caused by interactions amongst two or more of the building blocks at the system level.

13. The method of designing an electronic circuit system according to claim 11 wherein the improved characteristics of said desirable output signals includes a reduction of the level of output signal ripple.

14. The method of designing an electronic circuit system according to claim 11 wherein the improved characteristics of said desirable output signals further includes a reduction of the level of output signal jitter.

15. The method of designing an electronic circuit system according to claim 11 wherein the improved characteristics of said desirable output signals further includes a reduction of the level of unwanted output signal oscillation.

16. The method of designing an electronic circuit system according to claim 11 wherein the improved characteristics of said desirable output signals further includes increasing an output signal dynamic range.

17. The method of designing an electronic circuit system according to claim 11 wherein the improved characteristics of said desirable output signals further includes increasing an output signal linearity.

18. The method of designing an electronic circuit system according to claim 11 wherein the improved characteristics of said desirable output signals further includes increasing the accuracy of an output signal waveform.

19. The method of designing an electronic circuit system according to claim 11 wherein the improved characteristics of said desirable output signals further includes increasing the accuracy of an output signal phase angle.

20. The method of designing an electronic circuit system according to claim 11 wherein the electronic circuit system is specifically selected from the group consisting of flip-flops and dividers, registers and counters, memories, timers, application specific logic circuits, Arithmetic and Logic Units (ALU), embedded controllers, microprocessors, digital and analog filters, phase and frequency detectors, frequency synthesizers, frequency synthesizers, multipliers and modulators, multipliers and modulators, multiplexers and demultiplexers, phase-locked loops, data converters, and multi-stage amplifiers.

* * * * *